Sept. 28, 1971 V. NEEDHAM 3,608,191

SEMICONDUCTOR ARRANGEMENTS

Filed Feb. 17, 1969 2 Sheets-Sheet 1

INVENTOR
Victor Needham
BY Holman, Glascock, Downing & Seebold
ATTORNEYS

Sept. 28, 1971 V. NEEDHAM 3,608,191

SEMICONDUCTOR ARRANGEMENTS

Filed Feb. 17, 1969 2 Sheets-Sheet 2

INVENTOR
Victor Needham
BY Holman, Glascock, Downing & Seebold
ATTORNEYS

United States Patent Office 3,608,191

Patented Sept. 28, 1971

3,608,191

SEMICONDUCTOR ARRANGEMENTS

Victor Needham, Balsall Common, near Coventry, England, assignor to Joseph Lucas (Industries) Limited, Birmingham, England Continuation-in-part of application Ser. No. 750,204, Aug. 5, 1968. This application Feb. 17, 1969, Ser. No. 799,892

Claims priority, application Great Britain, Aug. 3, 1967, 35,748/67; Feb. 21, 1968, 8,347/68; Feb. 27, 1968, 9,391/68

Int. Cl. H05k 3/30

U.S. Cl. 29—626 9 Claims

ABSTRACT OF THE DISCLOSURE

A semiconductor arrangement is disclosed which includes an anodised aluminium backing plate on which is deposited at least one area of conductive material. A semiconductor device is then secured to said area either directly or through the intermediary of the conductor. Alternatively, the aluminium can be the substrate of a thin film circuit, the circuit can be manufactured by anodising an aluminium plate, heating the plate to stress relieve the anodic layer, and finally depositing resistive and conductive components on the anodised aluminium and annealing the circuit to stabilise the resistor values. The components can then be secured to the circuit as necessary.

This invention, which is a continuation-in-part of my application No. 750,204, filed Aug. 5, 1968, now abandoned, relates to semiconductor arrangements and employs a backing plate of anodised aluminium which gives a number of advantages not previously realised in semiconductor arrangements. Thus, in one aspect the invention comprises an anodised aluminium backing plate, at least one area of conductive material deposited on said backing plate, and a semiconductor device secured to said area either directly or through the intermediary of a conductor. In another aspect, the invention relates to thin film circuits, and resides in a thin film circuit in which the substrate is anodised aluminium.

The use of anodised aluminium as a substrate has the great advantage that the substrate has good mechanical strength and is a good heat sink. Moreover, the substrate has an inherent capacitance between its surface and the aluminium layer. This capacitance can be utilised in designing circuits, so avoiding the necessity of mounting capacitors on the thin film circuit.

Figure 1:
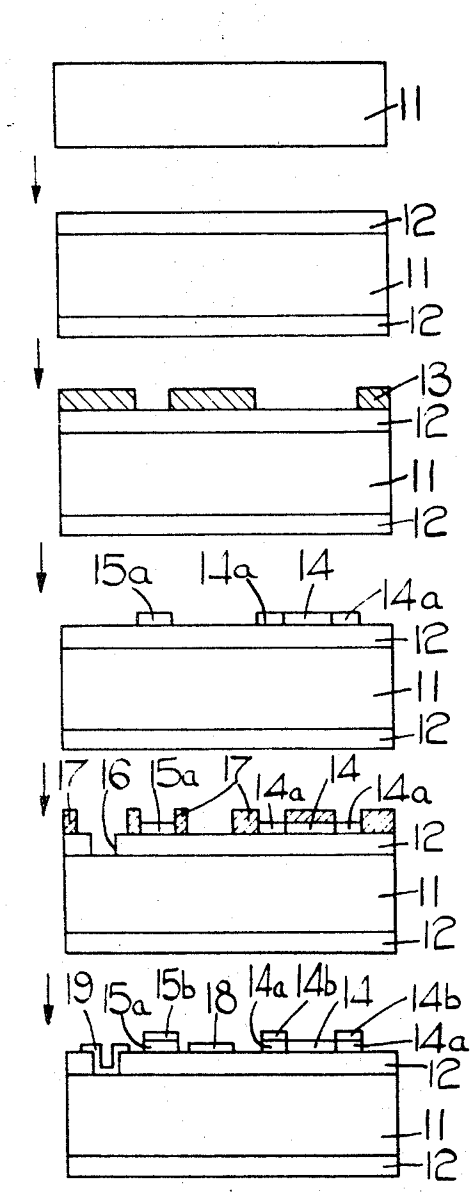
FIG. 1 is a flow sheet illustrating one example of the invention.

Referring to FIG. 1, an aluminium plate 11 0.040 inch thick having a surface roughness less than 0.5 micron peak to peak was immersed for two hours in an aqueous solution of an alkaline detergent, this treatment giving the surface a light etch to remove traces of organic residues from the surface. The plate was then anodised to form anodic layers 12, by making it the anode in a 10% solution of chromic acid at 40° C., using a stainless steel cathode with a voltage of 30 volts between the anode and cathode. The anodising time depends on the thickness of oxide required, but with the parameters mentioned above must be less than 60 minutes, because anodising times in excess of 60 minutes are found to cause the surface finish of the oxide layer to deteriorate. In a typical example with the treatment bath at 40° C. an anodising time of 30 minutes produced an oxide layer of 3.5 microns thickness having an inherent capacitance of 15,000 pf. per square inch to the aluminium. This figure decreased to 10,000 pf. per square inch for films of 5 microns thickness produced after 40 minutes anodising. In another example, the treatment temperature was 20° C. and a treatment time of 300 minutes did not affect the surface finish adversely, but produced an oxide layer 6.5 microns thick with an inherent capacitance of 6000 pf. This figure increased to 10,000 pf. per square inch for films of 5 microns thickness formed after 230 minutes treatment. In each case, insulation resistance was found to be better than 100 megohms per square inch at 80 volts D.C. It will thus be appreciated that the parameters chosen can very widely, and will depend on the particular application for which the thin film circuit is intended. However, treatment temperatures in excess of 50° C. are undesirable.

After the anodising process, the plate was thoroughly washed in running water to remove any traces of chromium salts retained in the anodic layers 12. It is found that if the salts are not completely removed, any thin film circuit produced using the anodised aluminium substrate will not be satisfactory. After the washing operation, the slice was boiled in acetone to remove all traces of water, and was then heated for 10 minutes at 400° C. to stress relieve the anodic layers 12. This step has been found to be essential if the annealing process used later to stabilise the film resistor values is to give consistent results within a small tolerance range. The temperature of 400° C. is chosen to be in excess of that which is used during the annealing process.

The substrate formed as above is now utilised to form a thin film printed circuit, and in this respect it must be emphasised that the drawing is purely diagrammatic, and that the layers are not to scale.

A mask 13 formed from stress relieved mild steel has apertures formed therein corresponding to positions at which resistive components are required, and also at positions where soldering is to be effected later in the operation. The substrate is held in position by locating pins and lightly pressed onto the mask 13 by a leaf spring, and the substrate and mask is then loaded into a vacuum system which is exhausted to a pressure of $2\times10^{-6}$ Torr after which the pressure is increased to $3\times10^{-4}$ Torr by introducing argon. At this pressure a low voltage arc is struck between an anode and a cathode. When the main discharge has been stabilised at 6 amperes a large negative voltage of the order of 800 volts is applied to a Nichrome target situated approximately 10 centimeters away from and parallel with the mask and substrate. Nichrome is removed from the target and deposited on the substrate as permitted by the mask. It will be seen that with the particular mask 13 shown a resistive component 14 has been deposited having extensions 14_a_, together with a discrete area 15_a_, the areas 14_a_, 15_a_ being areas to which soldered connections will be made later.

Following the Nichrome deposition, a second mask 17 is located relative to the substrate. In the schematic example illustrated, it is assumed that a capacitor is required in the circuit, and before the mask 17 is placed on the substrate a hole 16 is made in the upper anodic layer 12, this hole being surrounded by part of the mask 17. The mask 17, which is formed in the same way as the mask 13, defines apertures in which conductive components are to be deposited, as well as defining an aperture around the hole 16, and around the areas 14*a*, 15*a*. The substrate and mask 17 are then placed in a vacuum system as before, but this time nickel is deposited to form a conductive component 18, nickel areas **14*b*, 15*b* on top of the Nichrome areas 14*a*, 15*a* respectively, and a conductive region 19 which is electrically connected to the aluminium layer 11 and is exposed on the upper surface. The connections to the capacitor are, of course, made between the area 19 and a suitable area 14** on the substrate.

The final step is to locate the required components, for example transistors and diodes, on the circuit and form the required connections thereto, preferably by soldering. It is found that the provision of Nichrome beneath the nickel at the soldering points considerably improves the strength of the soldered joints. Prior to the soldering step, the resistance values are stabilised by annealing, for example by heating at 300° C. for 30 minutes.

It has been found that where the printed circuit is to be subjected at any time to temperatures in excess of 120° C., then the only satisfactory way of anodising aluminium is by electro-chemically treating it in chromic acid as described above. A soldering operation involves a temperature in excess of 120° C., and so where the components are to be secured to the printed circuit by soldering, the chromic acid anodisation treatment is essential. However, in some examples the components may be secured to the printed circuit other than by soldering, for example by ultrasonic bonding, and in this case anodisation can be effected in any other convenient known manner. It will, of course, be necessary to ensure that the intended use of the circuit would not involve subjection of the circuit to temperature in excess of 120° C. Where the components are secured in position by ultrasonic bonding, the nickel which is deposited is preferably replaced by aluminium.

Where no resistive components are printed on the circuit, the stress relieving and annealing steps are not essential.

Figure 2:
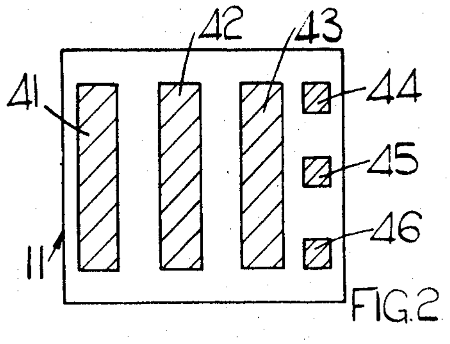
FIGS. 2 and 3 show a specific device which can be manufactured according to the invention.
Figure 3:
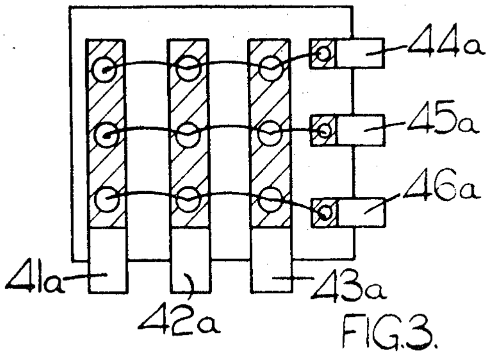

A specific application of the invention is shown in FIGS. 2 to 7. Referring first to FIGS. 2 and 3, an anodised aluminium sheet 11 having conductors arranged thereon in the pattern shown is produced as described above. The device is intended for use in a battery charging system having a three phase alternator, and incorporates nine diodes, six of which give a full wave rectified output, and the other three of which gives an output to a filed winding. It is therefore required to have three output terminals and three input terminals for connection to the phases of the alternator. As seen in FIG. 1, the thin film consists of three principal conductors 41, 42, 43, and three smaller conductors 44, 45, 46. Output terminals **41*a* to 46*a* are soldered to the substrate in contact with the conductors 41 to 46 respectively, and three diodes are soldered to each of the conductors 41, 42, 43. Assuming, for convenience, that the terminals 41*a* and 42*a* are the main output terminals, with the terminal 43*a* providing the output terminal to the field winding and having the same polarity as the terminals 41*a*, then typically the anodes of three diodes are soldered to the conductor 41, and the anodes of three further diodes soldered to the conductor 43. The cathodes of three diodes are soldered to the conductor 42, and conductors are then soldered to the free terminals of one diode on each of the conductors 41, 42, 43, and to the appropriate terminal 44*a*, 45*a*, 46*a***, so that the entire arrangement constitutes a bridge rectifier with three additional diodes.

Figure 4:
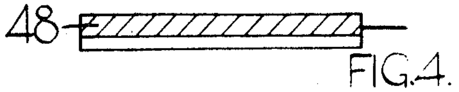
FIGS. 4 to 7 show further steps in the manufacture of the device.
Figure 5:
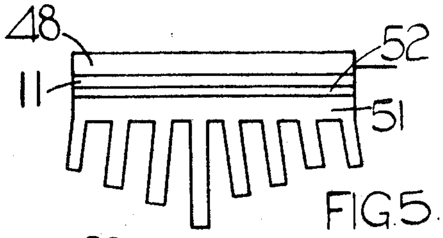

The next step, shown in FIG. 4, is to encapsulate the device shown in FIGS. 2 and 3 with a thermoplastic material 48 capable of standing temperatures of the order of 200° C. The device is then bolted to a finned aluminium heat sink 51 with the interposition of a thermal conducting medium 52 to reduce the thermal resistance between the device and the heat sink 51. The aluminium substrate acts as a heat sink, but for the particular application now being described it is preferably to incorporate an additional heat sink 51. The device is now ready for use.

Figure 6:
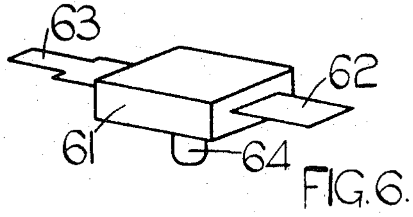
Figure 7:
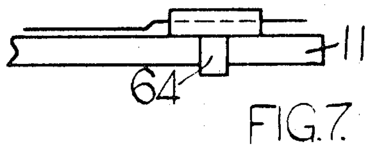

FIGS. 6 and 7 illustrate a particularly convenient arrangement for affixing the external terminals to the aluminium substrate 11. A terminal blade has moulded around it a thermoplastic body 61 so that the blade itself shown at 62 extends from one side of the body 61, and a metallic finger 63 extends from the other side of the body 61. The body is moulded with a peg 64 which as shown in FIG. 7 engages the aluminium substrate 11. The peg is deformed in any convenient manner to affix the body to the substrate, and the finger 63 is soldered to the appropriate conductor on the substrate.

Figure 8:
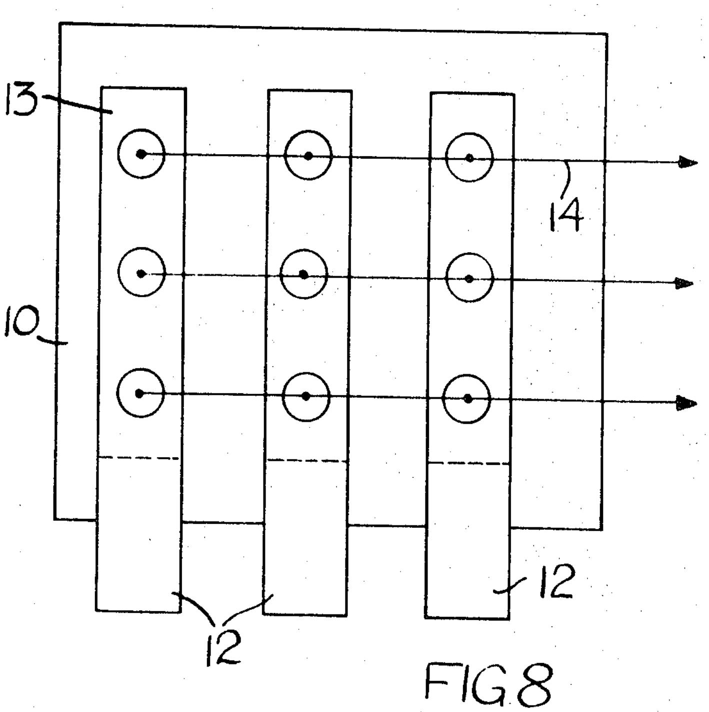
FIG. 8 is a plan view of a rectifier manufactured according to another example of the invention.
Figure 9:
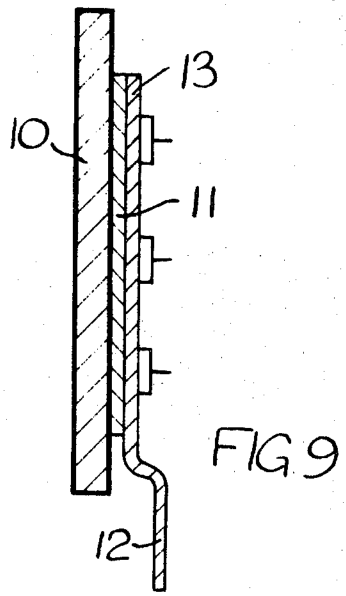
FIG. 9 is a section on the line A—A in FIG. 8.

Referring now to FIGS. 8 and 9 there is provided an anodised aluminium backing plate 110 on which is sputtered three conductive areas of nickel-coated Nichrome in the form of strips 111. The strips 111 are supported in much the same way as when forming a thin film circuit, and are used to secure to the backing plate 110 by soldering, three conductive strips 112 each of which carries three diodes 113, two of the strips 112 making a common anode connection to the diodes and the other strip making a common cathode connection to the diodes. The rectifier is intended for use with a three phase alternator to provide a rectified output and a separate output to the field winding of the alternator, and for this purpose leads 114 are used to join one diode associated with each plate, and to connect the three diodes thus joined to one phase of the alternator. The conductive strips 112 then provide the required output.

In another example, a combined regulator and rectifier for a three phase permanent magnet alternator is manufactured in a similar manner using only two strips 112, one of which carries three thyristors and the other of which carries three diodes.

It is not necessary for the connection between the semiconductor device and the conductive area to be made through a separate conductor, although clearly it is more convenient to do so where, as in the examples described more than one device is to be connected to the plate 110 and the devices have to be interconnected. The connection to the conductive area could be made other than by soldering, for example by ultrasonic bonding.

Having thus described my invention what I claim as new and desire to secure by Letters Patent is:

1. A method of manufacturing a thin film printed circuit, comprising the steps of anodising an aluminium plate, heating the plate to stress relieve the anodic layer, vacuum depositing resistive and conductive components of the stress relieved, anodised aluminium, annealing the circuit to stabilise the values of the resistive components, and securing the required components to the circuit.

2. A method as claimed in claim 1 in which the components are secured to the printed circuit by soldering, and the aluminium is anodised electro-chemically in chromic acid.

3. A method as claimed in claim 2 in which the solder is a fluxless solder.

4. A method as claimed in claim 2 in which the temperature of the electro-chemical bath is below 50° C.

5. A method as claimed in claim 2 in which the areas of the printed circuit to which soldered connections are to be made are coated first with the material used to form the resistive components and then with the material used to form the conductive components.

6. A method as claimed in claim 2 in which prior to the electro-chemical treatment the aluminium plate is lightly etched to remove organic residues, and between the electro-chemical treatment and stress relieving treatment all traces of chromium salts and water are removed from the plate.

7. A method as claimed in claim 1 in which a capacitor is incorporated in the circuit, one plate of the capacitor being constituted by the aluminium and the other plate being constituted by conductive material deposited on the anodic layer.

8. A method as claimed in claim 7 in which a connection to the plate of the capacitor constituted by the aluminium is made by forming a hole in the anodic layer and then depositing conductive material in the hole.

9. A method of forming a thin film circuit, comprising the following steps:

(i) lightly etching an aluminium plate to remove any organic residues,
(ii) anodising the plate,
(iii) depositing conductive components on the plate,
(iv) securing devices to the plate and making the required connections to the conductive components.

References Cited

UNITED STATES PATENTS

| | | | |
|---|---|---|---|
| 3,294,653 | 12/1966 | Keller et al. | 204—15 |
| 3,380,156 | 4/1968 | Lood et al. | 29—620 |
| 3,488,262 | 1/1970 | Forester | 204—37 |
| 3,506,887 | 4/1970 | Gutteridge | 204—15 |
| 3,337,426 | 8/1967 | Celto | 204—15 |

JOHN F. CAMPBELL, Primary Examiner

D. M. HEIST, Assistant Examiner

U.S. Cl. X.R.

29—624, 625